United States Patent [19]

Tahim et al.

[11] Patent Number: 4,521,747
[45] Date of Patent: Jun. 4, 1985

[54] SUSPENDED STRIPLINE VARACTOR-TUNED GUNN OSCILLATOR

[75] Inventors: Raghbir S. Tahim, Buena Park; George M. Hayashibara, Wilmington; Kai Chang, Rancho Palos Verdes, all of Calif.

[73] Assignee: TRW Inc., Redondo Beach, Calif.

[21] Appl. No.: 540,471

[22] Filed: Oct. 11, 1983

[51] Int. Cl.³ .............................................. H03B 9/14
[52] U.S. Cl. .............................. 331/107 SL; 331/101; 331/177 V
[58] Field of Search ............ 331/96, 99, 101, 107 DP, 331/107 SL, 107 C, 107 G, 177 V, 36 C

[56] References Cited

U.S. PATENT DOCUMENTS 3,680,002 7/1972 Quine ..................................... 331/96
3,969,689 7/1976 Corrons et al. .................. 331/101 X
3,984,787 10/1976 Rosen et al. ...................... 331/101 X

FOREIGN PATENT DOCUMENTS 1367303 9/1974 United Kingdom .
1394912 5/1975 United Kingdom .

*Primary Examiner*—Siegfried H. Grimm
*Attorney, Agent, or Firm*—Noel F. Heal; Robert M. Wallace; Donald R. Nyhagen

[57] ABSTRACT

Improved output power performance is obtained in a millimeter-wave integrated-circuit (MIC) voltage-controlled oscillator by forming an output circuit and a bias input circuit in a suspended stripline configuration, which is subject to relatively low losses compared with microstrip designs. A Gunn diode and a varactor diode are mounted in alignment and in close proximity to each other. The suspended microstrip configuration includes a suspended substrate with a Gunn diode output circuit and a bias input circuit on one side, and a varactor diode grounding pad on the other face of the substrate. A sliding short-circuit device aligned with the Gunn diode output circuit provides tuning of the oscillator over a relatively wide range, and avoids having to trim the Gunn diode circuit components for final adjustment of the frequency.

8 Claims, 6 Drawing Figures

U.S. Patent  Jun. 4, 1985  4,521,747
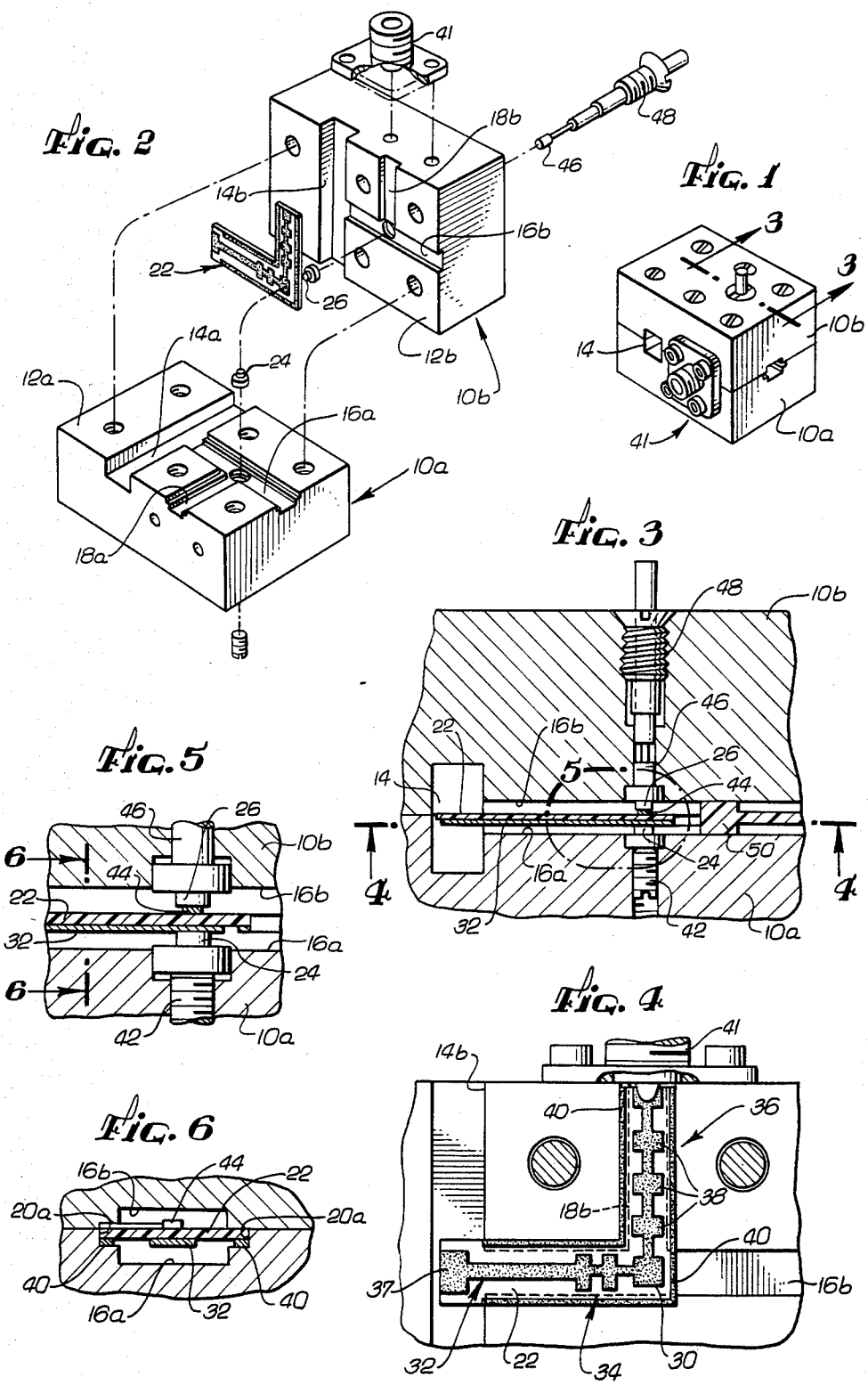

SUSPENDED STRIPLINE VARACTOR-TUNED GUNN OSCILLATOR

BACKGROUND OF THE INVENTION

This invention relates generally to Gunn diode oscillators, and more particularly, to Gunn diode oscillators that may be tuned by a varactor. Varactor-tuned Gunn diodes are important components used as local oscillators in receivers and as power/driver stages in transmitters. Basically, varactor tuning provides a means for varying the frequency of the oscillator in accordance with the value of a dc bias signal applied to the varactor. The combination of a Gunn diode and a varactor functions as a voltage-controlled oscillator (VCO), which may be used in a phase-locked loop to lock onto a received carrier signal, or may be used to tune an oscillator over a wide range of frequencies.

In most communications systems operating at extremely high frequencies, typically in the millimeter-wave region, it is desired to minimize the weight, size and cost of the components. Most millimeter-wave Gunn VCO's are limited to configurations employing waveguides, which are inherently difficult to make a low cost and in small sizes. For example, power outputs of 100-150 milliwatt (mW) have been achieved using waveguide techniques at Q-band frequencies (33 to 50 gigahertz).

However, the use of millimeter-wave integrated circuits (MIC) for the same purpose has not been particularly successful. MIC devices are, of course, smaller, lighter and, when fabricated in relatively large quantities, less costly than their waveguide counterparts. However, MIC oscillators have in the past employed microstrip configurations, in which a conductive strip is disposed on a dielectric substrate. Such devices are subject to excessive circuit losses. Typical power outputs in the Q-band frequencies have been below 50 mW. For example, a 40 mW microstrip configuration is described by David Rubin in "Varactor-Tuned MillimeterWave MIC Oscillator," IEEE Trans. on Microwave Theory & Tech., Vol. MTT-24, Nov. 1976, pp. 866-67.

It will be appreciated from the foregoing that there is a need for improvement in the field of MIC oscillator devices for use in the millimeter wave region. The present invention satisfies this need.

SUMMARY OF THE INVENTION

The present invention resides in a millimeter-wave integrated-circuit (MIC) voltage-controlled oscillator with relatively high power output at millimeter-wave frequencies. Basically, and in general terms, the oscillator of the invention comprises a Gunn diode connection circuit fabricated as a suspended stripline, and including an insulating substrate, a Gunn diode contact pad on a first face of the substrate, a dc bias input circuit connected to the contact pad and having lowpass filter means, and an output circuit connected to the contact pad and including an impedance-matching section. The oscillator also includes a Gunn diode mounted in connection with the contact pad, a varactor contact pad on the second face of the substrate, opposite the Gunn diode contact pad, and a varactor diode mounted in substantial alignment with the Gunn diode, in contact with the varactor contact pad.

The combination of a Gunn diode circuit in suspended stripline form, and a multi-section impedance-matching section in the output circuit, results in a substantial increase in output power as compared with prior integrated-circuit designs using a microstrip configuration. Moreover, the alignment of the varactor diode and the Gunn diode in close proximity appears to provide better coupling between the two, and results in improved operating characteristics. Another important advantage of the suspended stripline configuration is that adjustments to the device can be conveniently made without any soldering operations. After adjustment, such as by trimming portions of the circuitry, the device can be conveniently reassembled with the Gunn diode and varactor diode returned reliably to their former positions and relationships.

More specifically, the substrate is suspended within a passage in a block of metal that forms a ground plane for the device. The substrate is clamped in position near the middle of the passage, which includes an output section through which output energy is transmitted, and a bias input section approximately at right-angles to the output section. The Gunn diode and the varactor diode are aligned along an axis that is orthogonal with the axes of the output section and the bias input section of the passage.

The Gunn diode is held in position by mounting means that include a ground contact connecting one terminal of the Gunn diode to the ground plane, the other terminal being held in contact with the Gunn diode contact pad on the substrate. A resiliently biased contact probe makes contact with one terminal of the varactor diode, and urges the other terminal toward the varactor contact pad on the substrate.

In accordance with another aspect of the invention, the device also includes sliding short-circuit means mounted in alignment with the output circuit. The sliding short-circuit means includes a passage section colinear with the output passage section, and a grounded movable termination block. Axial adjustment of this block provides frequency tuning of the device over a limited but relatively wide range.

It will be appreciated from the foregoing that the present invention represents a significant advance in the field of MIC voltage-controlled oscillators. In particular, the oscillator device of the invention has better power output and performance characteristics than its microstrip counterparts, and is much smaller, lighter and less costly than waveguide devices for the same purpose. Other aspects and advantages of the invention will become apparent from the following more detailed description, taken in conjunction with the accompanying drawings.

BRIEF DESCRIPTION OF THE DRAWINGS

FIG. 1 is a perspective view of a partially assembled voltage-controlled oscillator device constructed in accordance with the invention;

FIG. 2 is an enlarged and exploded perspective view of the device of FIG. 1;

FIG. 3 is a further enlarged sectional view taken substantially along the line 3—3 in FIG. 1 and showing the arrangement of a Gunn diode and a varactor diode in relation to a suspended stripline circuit;

FIG. 4 is a sectional view taken substantially along the line 4—4 in FIG. 3 and showing the suspended stripline circuit in plan view;

FIG. 5 is an enlarged fragmentary view of the portion of FIG. 3 indicated by the numeral 5; and FIG. 6 is a sectional view taken substantially along the line 6—6 in FIG. 5.

DESCRIPTION OF THE PREFERRED EMBODIMENT

As shown in the drawings for purposes of illustration, the present invention is concerned with voltage-controlled oscillators, especially for use in the millimeter-wavelength region of the spectrum. In the past, device configurations employing millimeter-wave integrated circuits (MIC) have been unable to match the power output of waveguide devices, and have suffered from other significant disadvantages.

In accordance with the invention, a voltage-controlled oscillator employs a suspended stripline circuit and includes a novel arangement of Gunn and varactor diodes. The oscillator of the invention provides a relatively high power output, comparable with that of waveguide devices, but has significantly lower size, weight, and cost.

As shown in FIGS. 1 and 2, the device of the invention is housed in a metal block, the two separable halves of which are indicated by reference numerals 10a and 10b, which have faces 12a and 12b, respectively, that are clamped together in an assembled position. Each block half has a transverse channel 14a and 14b across the width of the faces 12a and 12b, which together form an output passage 14 when the halves of the block are assembled. Leading from the midpoint of the transverse channels 14a and 14b, and perpendicularly to the transverse channels, are respectively channels 16a and 16b, which extend across to an edge of each block half. Leading perpendicularly from each of the channels 16a and 16b are yet another pair of channels 18a and 18b, which extend across the block faces 12a and 12b from the channels 16a and 16b to one edge of each block half.

In block half 10a, the channels 16a and 18a have a recess or lip 20a, best shown in FIG. 6, extending along each edge of each channel. A generally L-shaped substrate 22 of insulating material is disposed on the lip 20a. The substrate 22 may be of any suitable material, such as Duroid 5880, and its thickness of approximately 0.01 inch is the same as or slightly greater than the depth of the lip 20a. Thus, when the block halves 10a and 10b are assembled, the substrate 22 is suspended at the midpoint of the passages 16 and 18 formed by the channels 16a, 16b, 18a and 18b. This is best shown in FIG. 6.

As best shown in FIG. 5, a Gunn diode 24 and a varactor diode 26 are disposed on opposite faces of the substrate 22, at the intersection of passages 16 and 18 in the block 10. The Gunn diode 24 is on the "a" half of the block 10 and the varactor diode 26 is on the "b" half, in substantial alignment with the Gunn diode. The Gunn diode 24 may be any suitable packaged Gunn diode, such as part number MA 49838 manufactured by Microwave Associates. The varactor diode 26 may, for example, be part number 46600, manufactured by Microwave Associates or by Alpha Industries Corporation.

The substrate 22 has metallized circuit patterns printed on both its faces. On the face of the substrate 22 adjacent to the Gunn diode 24 is a circuit pattern defining circuit connectors to the Gunn diode and forming a suspended stripline for output from the device. The circuit pattern includes a Gunn diode contact pad 30, and an output circuit 32 extending along passage 16 toward the output passage 14. The output circuit 32 connects with the Gunn diode contact pad 30 and includes a multi-section impedance-matching transformer 34, to match the relatively low (approximately 8 ohms) impedance of the Gunn diode to the output line impedance (approximately 50 ohms). The output circuit 32 terminates in a symmetrical probe 37 disposed in the output passage 14, through which output energy from the device is transmitted. The termination probe 37 is not part of the invention, since the output energy may instead be coupled to another component on the same substrate.

Printed on the same side of the substrate 22 as the output circuit 32 is a bias input circuit 36 extending along passage 18 of the device. The bias input circuit 36 is also connected to the Gunn diode contact pad 30, and includes a plurality of sections of increased width, indicated at 38, to function as a lowpass filter to prevent radio-frequency energy from radiating along the bias input path. Also printed on the substrate 22 are metallized edge strips 40. These contact the block half 10a at the lip 20a and form part of the ground plane of the device.

A positive bias voltage is applied to the Gunn diode 24 through the bias input circuit 36, which is connected to an electrical terminal 41 on the block 10. A ground connection to the Gunn diode 24 is established through a support screw 42 extending through block half 10a.

On the opposite face of the substrate 22, adjacent to the varactor diode 26, there is a printed varactor diode contact pad 44 connected to an edge strip 40b on the substrate 22. The pad 44 makes contact with one terminal of the varactor diode 26 and establishes a connection to the ground plane of the device. A negative bias voltage is applied to the other terminal of the varactor diode 26 through a spring-loaded contact probe 46, which may be adjusted by rotation of an insulated screw 48 in block half 10b.

The theory of operation of varactor controlled Gunn diode oscillators is well known, and not the subject matter of this invention. Basically, the Gunn diode 24 exhibits a negative resistance under some conditions, and when this is appropriately matched with a load impedance, oscillation results. The frequency of oscillation can be controlled to some degree by trimming the size and shape of the Gunn diode contact pad 30 and of the impedance-matching transformer 34. The varactor diode 26 is basically a variable capacitor connected in parallel with the Gunn diode 24. When the varactor diode bias voltage is changed, its capacitance changes and the frequency of oscillation of the Gunn diode is varied accordingly.

In the illustrative embodiment of the invention, variation of the varactor bias voltage over an approximately twenty-volt range results in a tuning range of approximately 300 MHz at a nominal output frequency of around 40 GHz. Significantly, the output power of the device is relatively constant at about 100 mW over the frequency tuning range. With the varactor diode disconnected, the output power of the device was found to be relatively constant at about 150 mW for frequencies adjusted over a range from 33 to 41.5 GHz.

Another feature of the invention is its a fine tuning capability without the need for trimming the contact pad geometry. This function is provided by means of a sliding short-circuit device 50 (FIG. 3) installed in the passage 16 on the other side of the diodes 24 and 26 from the output circuit 32. The sliding short-circuit device 50, which takes the form of a metal termination of the passage 16, is movable along the same axis as that of the output circuit suspended stripline 32. Adjustment of the position of the sliding device 50 provides a tuning range of approximately 1.2 GHz. This permits final tuning of the device without having to rely on trial-and-error trimming techniques.

It will be appreciated from the foregoing that the present invention represents a significant advance in the field of Gunn diode oscillators. In particular, the invention provides an oscillator with a higher power output than comparable devices using integrated-circuit techniques, yet is of smaller size and weight than waveguide devices for the same purpose. The device has the additional advantage of an adjustable short-circuit device for tuning over a wide range. Furthermore, the integrated-circuit configuration renders the device easy to integrate with other components that may be formed on the same substrate. It will also be appreciated that, although a specific embodiment of the invention has been described in detail for purposes of illustration, various modifications may be made without departing from the spirit and scope of the invention. For example, the substrate 22 may take the form of a more extensive layer that includes other components of a receiver or transmitter subsystem. Accordingly, the invention should not be limited except as by the appended claims.

We claim:

1. A voltage-controlled oscillator with high power output characteristics at millimeter-wavelength frequencies, said oscillator employing integrated-circuit techniques and comprising:
   a Gunn diode circuit fabricated as a suspended stripline, and including
      an insulating substrate,
      a Gunn diode contact pad on a first face of said substrate,
      a dc bias input circuit connected to said contact pad and including lowpass filter means, and
      an output circuit connected to said contact pad and including an impedance-matching section;
   a Gunn diode mounted in electrical connection with said contact pad;
   a varactor contact pad on the second face of said substrate opposite said Gunn diode contact pad; and
   a varactor diode mounted in substantial alignment with said Gunn diode, in contact with said varactor contact pad.

2. A voltage-controlled oscillator as set forth in claim 1, and further including:
   adjustable short-circuit means aligned with said output circuit and providing adjustment of the frequency of the oscillator.

3. A voltage-controlled oscillator as set forth in claim 1, wherein:
   said impedance-matching section has multiple sections to effect an impedance match between said Gunn diode and the impedance of said output circuit stripline.

4. A voltage-controlled oscillator with high power output characteristics at millimeter-wavelength frequencies, said oscillator comprising:
   a conductive block serving as a device ground plane;
   a first passage formed in said block;
   a second passage formed in said block and intersecting with said first passage;
   a stripline circuit suspended in said first and second passages and including
      an insulating substrate secured in said first and second passages,
      a Gunn diode contact pad on a first face of said substrate at the intersection of said first and second passages,
      a dc bias input circuit connected to said contact pad, extending along said second passage, and including lowpass filter means, and
      an output circuit connected to said contact pad, extending along said first passage, and including an impedance-matching section;
   a Gunn diode mounted in electrical connection with said contact pad;
   means for supporting said Gunn diode and connecting one of its terminals to said block;
   a varactor contact pad connected to said block and located on the second face of said substrate, opposite said Gunn diode contact pad;
   a varactor diode mounted in substantial alignment with said Gunn diode, with one of its terminals in contact with said varactor contact pad; and
   means for securing said varactor diode in position and making contact with the other of its terminals to apply a bias voltage.

5. A voltage-controlled oscillator as set forth in claim 4, and further including:
   a slideable short-circuit device in the form of a metal piston slideably fitted in said first passage on the opposite side of the second passage fron said output circuit, whereby the frequency of oscillation may be adjusted by sliding said piston.

6. A voltage-controlled oscillator as set forth in claim 4, wherein:
   said impedance-matching section includes multiple sections to effect an impedance match between said Gunn diode and said output circuit stripline.

7. A voltage-controlled oscillator providing improved power output performance without excessive size or cost, said oscillator comprising:
   a grounded support housing;
   a substrate suitable for mounting in said housing;
   a Gunn diode circuit formed on a first face of said substrate and including a Gunn diode contact pad, a bias input circuit and an output circuit;
   means for mounting said substrate in said support housing to secure said Gunn diode circuit in a suspended stripline configuration in a pair of passages formed in said housing, said contact pad being located at the intersection of the passages;
   a Gunn diode mounted in contact with said contact pad;
   a varactor diode mounted in substantial alignment with said Gunn diode, adjacent to a second face of said substrate;
   a grounded varactor contact pad on the second face of said substrate; and
   means for applying a bias voltage to said varactor diode.

8. A voltage-controlled oscillator as set forth in claim 7, and further including means for adjusting the frequency of oscillation by adjusting the effective length of the passage in which said output circuit is suspended.

* * * * *